United States Patent
Li

(10) Patent No.: US 11,404,491 B2
(45) Date of Patent: Aug. 2, 2022

(54) DISPLAY PANEL HAVING BLACK MATRIX LAYER IN DIRECT CONTACT WITH CONDUCTIVE LAYER AND METHOD OF MANUFACTURING THE SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Xianglong Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 193 days.

(21) Appl. No.: 16/625,078

(22) PCT Filed: Dec. 17, 2019

(86) PCT No.: PCT/CN2019/125806
§ 371 (c)(1),
(2) Date: Dec. 20, 2019

(87) PCT Pub. No.: WO2021/109231
PCT Pub. Date: Jun. 10, 2021

(65) Prior Publication Data
US 2021/0343792 A1 Nov. 4, 2021

(30) Foreign Application Priority Data
Dec. 5, 2019 (CN) .......................... 201911237048.3

(51) Int. Cl.
*H01L 27/32* (2006.01)
*H01L 51/00* (2006.01)
*H01L 51/52* (2006.01)

(52) U.S. Cl.
CPC .......... *H01L 27/322* (2013.01); *H01L 51/001* (2013.01); *H01L 51/0096* (2013.01); *H01L 51/5284* (2013.01); *H01L 2251/558* (2013.01)

(58) Field of Classification Search
USPC .......................................... 257/89
See application file for complete search history.

(56) References Cited

U.S. PATENT DOCUMENTS

| | | | | |
|---|---|---|---|---|
| 5,721,599 A | * | 2/1998 | Cheng | ............... G02F 1/134309 349/106 |
| 2004/0185604 A1 | * | 9/2004 | Park | ........................ H01L 27/12 438/149 |

(Continued)

FOREIGN PATENT DOCUMENTS

| CN | 101908529 A | 12/2010 |
|---|---|---|
| CN | 103681775 A | 3/2014 |

(Continued)

*Primary Examiner* — Nduka E Ojeh
(74) *Attorney, Agent, or Firm* — Dickinson Wright PLLC

(57) ABSTRACT

A display panel and a method of manufacturing the same are provided. The method includes: forming a color filter layer on a glass substrate, the color filter layer including a plurality of color resist matrices having a plurality of colors; forming a black matrix layer between the color resist matrices having the plurality of colors, the black matrix layer including a plurality of black matrices, wherein the black matrices have electrical conductivity, and a position of the black matrices corresponds to a position of a transparent electrode. In the above manner, uniformity of light emission of the display panel can be effectively improved.

10 Claims, 3 Drawing Sheets

(56) References Cited

U.S. PATENT DOCUMENTS

| | | | | |
|---|---|---|---|---|
| 2009/0191654 A1* | 7/2009 | Yu | ............................ | H01L 27/124 |
| | | | | 438/29 |
| 2013/0162549 A1* | 6/2013 | Kim | ........................ | G06F 3/0412 |
| | | | | 977/734 |
| 2014/0162178 A1* | 6/2014 | Na | .......................... | G03F 7/0045 |
| | | | | 430/7 |
| 2017/0261849 A1* | 9/2017 | Tang | .................. | G02F 1/133512 |
| 2018/0113354 A1* | 4/2018 | Zhang | ................. | G02F 1/133514 |

FOREIGN PATENT DOCUMENTS

| | | | |
|---|---|---|---|
| CN | 105974636 A | 9/2016 | |
| CN | 110085769 A | 8/2019 | |
| CN | 110222620 A | 9/2019 | |
| JP | 2014182252 A | 9/2014 | |

\* cited by examiner

DISPLAY PANEL HAVING BLACK MATRIX LAYER IN DIRECT CONTACT WITH CONDUCTIVE LAYER AND METHOD OF MANUFACTURING THE SAME

FIELD OF INVENTION

The present disclosure relates to the field of display technologies, and more particularly to a display panel and a method of manufacturing the same.

BACKGROUND OF INVENTION

Display devices based on organic light emitting diodes (OLEDs) (organic light emitting semiconductors) have significant advantages such as high color saturation, fast response, and self-illumination, and have more and more applications on mobile phones, tablets, and wearable devices. At a time when a demand for high resolution is increasing, a top emitting OLED device structure has a higher aperture ratio, and therefore it has broad application prospects in high-resolution OLED panels.

Currently, top emitting OLED structures typically have a microcavity effect. To achieve proper luminescence performance, it is necessary to use the microcavity effect to increase an OLED luminous efficiency performance. One of two electrodes of the top emitting OLED device needs to be translucent and the other needs to be fully reflective. The translucent electrode needs to be implemented with a transparent metal oxide or a thin layer of metal, but such electrode typically has lower conductivity and significant IR (voltage) drop in large area of light emitting panels. This will result in a darker illumination in a middle of the panel, resulting in a significant difference in brightness, affecting illumination uniformity of the panel.

SUMMARY OF INVENTION

A technical problem to be solved by the present invention is to provide a display panel and a method of manufacturing the same, which can improve illumination uniformity of the display panel.

In order to solve the above technical problem, a technical solution adopted by an embodiment of the present invention is to provide a display panel, comprising: forming a color filter layer on a glass substrate, wherein the color filter layer comprises a plurality of color resist matrices having a plurality of colors; and forming a black matrix layer between the color resist matrices having the plurality of colors, wherein the black matrices have electrical conductivity, and a position of the black matrices corresponds to a position of a transparent electrode.

In an embodiment of the present invention, forming the black matrix layer between the color resist matrices having the plurality of colors comprises: coating a black material having electrical conductivity on the color filter layer and performing a patterning operation on the black material to form the black matrix layer.

In an embodiment of the present invention, forming the black matrix layer between the color resist matrices having the plurality of colors comprises: coating a black material on the color filter layer and performing a patterning operation on the black material to form the black matrix layer; and forming a conductive layer on the black matrix layer.

In an embodiment of the present invention, forming the color filter layer on the glass substrate comprises: forming a plurality of monochromatic color resist matrices having one color on the glass substrate; and forming a monochromatic color resist matrix having a monochromatic color different from the one color of the monochromatic color resist matrices between the monochromatic color resist matrices; forming the monochromatic color resist matrices having the one color on the glass substrate comprises: coating a color filter material having the one color on the glass substrate to form a monochromatic color resist layer; performing a vacuum drying process on the monochromatic color resist layer; performing a curing process on the monochromatic color resist layer subjected to the vacuum drying process; and performing a patterning operation on the monochromatic color resist layer subjected to the curing process to form the monochromatic color resist matrices.

In an embodiment of the present invention, the color filter layer comprises color resist blocks having at least three colors, and/or a thickness of the color filter layer is greater than or equal to 0.1 um and less than or equal to 10 um.

In order to solve the above technical problem, another technical solution adopted by an embodiment of the present invention is to provide a display panel, comprising: a glass substrate; a color filter layer comprising a plurality of color resist matrices having a plurality of colors and disposed on a surface of the glass substrate; a black matrix layer disposed on a same side of the glass substrate as the color filter layer, wherein the black matrix layer comprises a plurality of black matrices, and the black matrices are not disposed lower than the color resist matrices and have electrical conductivity; and a transparent electrode correspondingly overlapped with the black matrices.

In an embodiment of the present invention, the black matrices are made of a conductive black material.

In the embodiment of the present invention, surfaces of the black matrices are provided with a conductive layer.

In the embodiment of the present invention, the color filter layer comprises color resist blocks having at least three colors.

In the embodiment of the present invention, a thickness of the color filter layer is greater than or equal to 0.1 um and less than or equal to 10 um.

Beneficial effects of the present application are that: in contrast to the prior art, an embodiment of the present invention provides black matrices having electrical conductivity. A position of the black matrices corresponds to a position of a transparent electrode, so that electrical conductivity of a translucent electrode is improved, IR (voltage) drop phenomenon is reduced, and illumination uniformity of the display panel is improved.

DETAILED DESCRIPTION OF PREFERRED EMBODIMENTS

Figure 1:
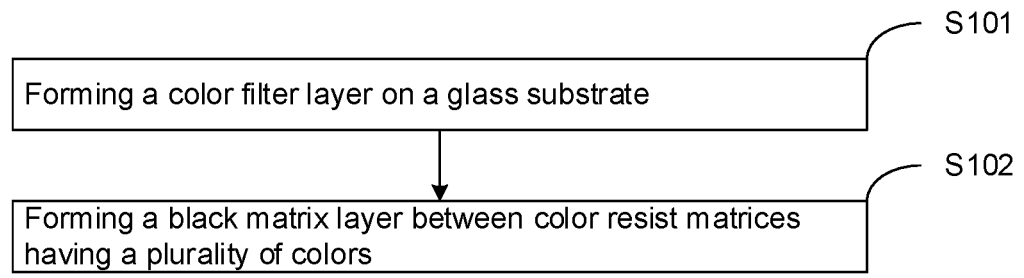
FIG. 1 is a schematic flowchart of a method of manufacturing a display panel according to an embodiment of the present invention.

The technical solutions in the embodiments of the present invention will be clearly and completely described in the following with reference to the accompanying drawings. It is apparent that the described embodiments are only a part of the embodiments of the present invention, and not all of them. All other embodiments obtained by those skilled in the art based on the embodiments of the present invention without creative efforts are within the scope of the present invention In the description of the present invention, it is to be noted that the terms "center", "upper", "lower", "left", "right", "vertical", "horizontal", "inside", "outside", etc. indicate an orientation or positional relationship is based on the orientation or positional relationship shown in the drawings, and is merely for the convenience of describing the present invention and the simplified description, and does not indicate or imply that the device or component referred to has a specific orientation, specific construction, and operation. Therefore, it can not to be construed as limiting the present invention. Moreover, the terms "first," "second," and "third" are used for descriptive purposes only and are not to be construed as indicating or implying relative importance.

In the description of the present invention, it should be noted that the terms "mounted," "linked," and "connected" are to be understood broadly unless otherwise specifically defined and limited. For example, it may be a fixed connection, a detachable connection, or an integral connection. It can be a mechanical connection or an electrical connection. They can be directly connected or indirectly connected through an intermediate medium. It can be an internal communication of the two components. The specific meaning of the above terms in the present invention can be understood in a specific case by those skilled in the art.

Referring to FIG. 1, FIG. 1 is a schematic flowchart of a method of manufacturing a display panel according to an embodiment of the present invention. The method of manufacturing the display panel provided by the embodiment of the present invention includes:

Step S101: forming a color filter layer on a glass substrate.

In a specific implementation scenario, the color filter layer is formed on the glass substrate, and the color filter layer includes color resists having at least three colors, such as three colors of red, green, and blue. In the embodiment, the color filter layer is formed by at least one of inkjet printing, blade coating, stamping, transfer, lifting, and the like.

Figure 2A:
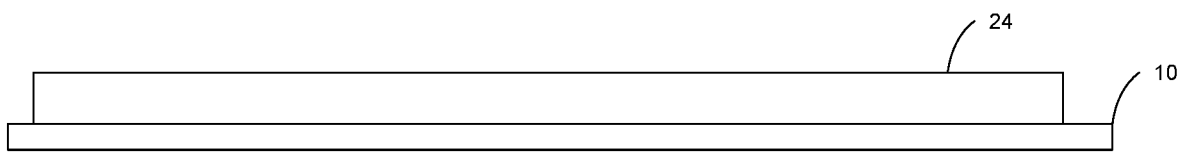
FIG. 2A is a schematic structural view of forming a monochromatic color resist layer on a glass substrate in a method of manufacturing a display panel according to an embodiment of the present invention.
Figure 2B:
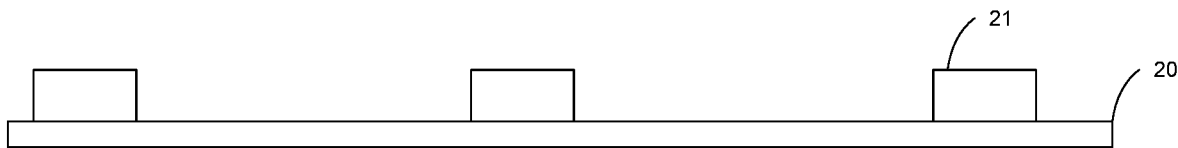
FIG. 2B is a schematic view showing a structure of forming monochromatic color resist matrices having one color on a glass substrate in a method of manufacturing a display panel according to an embodiment of the present invention.
Figure 2C:
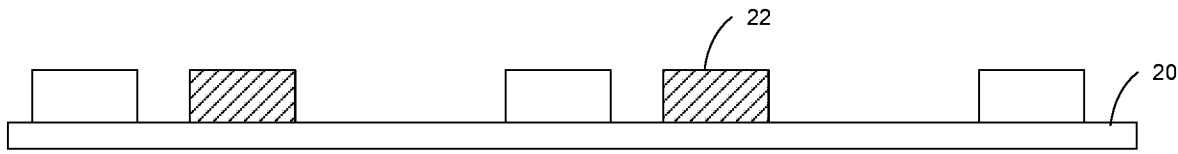
FIG. 2C is a schematic structural view of forming two-color color resist matrices having two colors on a glass substrate in a method of manufacturing a display panel according to an embodiment of the present invention.
Figure 2D:
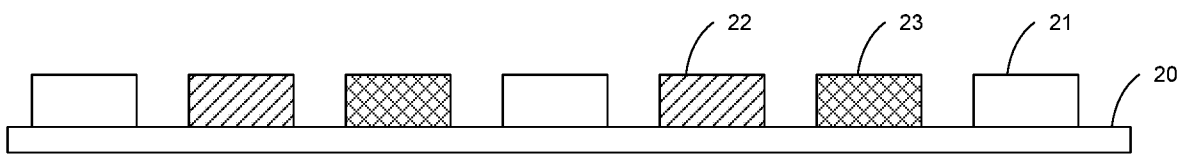
FIG. 2D is a schematic structural view of forming multicolor color resist matrices having three colors on a glass substrate in a method of manufacturing a display panel according to an embodiment of the present invention.

In details, referring to FIG. 2B to FIG. 2D, FIG. 2B is a schematic view showing a structure of forming monochromatic color resist matrices having one color on a glass substrate in a method of manufacturing a display panel according to an embodiment of the present invention, FIG. 2C is a schematic structural view of forming two-color color resist matrices having two colors on a glass substrate in a method of manufacturing a display panel according to an embodiment of the present invention, and FIG. 2D is a schematic structural view of forming multicolor color resist matrices having three colors on a glass substrate in a method of manufacturing a display panel according to an embodiment of the present invention. As shown in FIG. 2B, monochromatic color resist matrices 21 having one color, such as red color resist matrices, are first formed on the glass substrate 10. Color resist matrices 22 having another color, such as green color resist matrices, are formed between gaps of the red color resist matrices 21 as shown in FIG. 2C, which together with the red color resist matrices 21 constitute two-color color resist matrices. As shown in FIG. 2D, gaps between the green color resist matrices 22 and the red color resist matrices 21 are made into color resist matrices 23 having a third color, such as blue color resist matrices. A plurality of spaced-apart blue color resist matrices 23, green color resist matrices 22, and red color resist matrices 21 together form a color filter layer 20.

Step S102: forming a black matrix layer between a plurality of color resist matrices having a plurality of colors.

Figure 3:
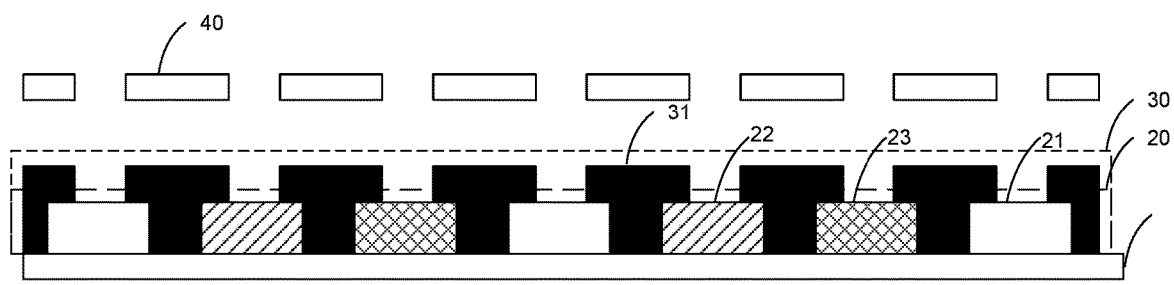
FIG. 3 is a schematic structural view of a first embodiment of a display panel provided by the present invention.

In a specific implementation scenario, referring to FIG. 3, FIG. 3 is a schematic structural view of a first embodiment of a display panel provided by the present invention. A black matrix layer 30 is formed between a plurality of color resistive matrices having a plurality of colors (for example, a plurality of blue resist matrices 23, green resist matrices 22, and red resist matrices 21). The black matrix layer 30 includes a plurality of black matrices 31. The plurality of black matrices 31 are disposed not lower than a plurality of color resist matrices having a plurality of colors (for example, a plurality of blue resist matrices 23, green resist matrices 22, and red resist matrices 21), have electrical conductivity and display panel, and correspond to a position of the transparent electrode of the display panel.

Figure 4:
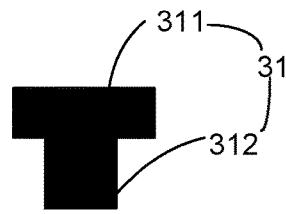
FIG. 4 is a schematic structural view of an embodiment of black matrices of a display panel provided by the present invention.

Referring to FIG. 4, FIG. 4 is a schematic structural view of an embodiment of black matrices of a display panel provided by the present invention. The black matrices 31 each include an upper structure 311 and a base structure 312. The upper structure 311 is rectangular. The base structure 312 is determined according to a gap between a plurality of color resist matrices having a plurality of colors (such as a plurality of blue color resist matrices 23, green color resist matrices 22, and red color resist matrices 21). For example, the gap between the plurality of color resist matrices having the plurality of colors is a rectangle, and the base structure 312 is rectangular. The black matrices 31 can be filled with a gap between a plurality of color resistive matrices having various colors to prevent light leakage. In order to further ensure light shielding effect of the black matrices 31, a cross-sectional area of the upper structure 311 is larger than a cross-sectional area of the base structure 312, so that both ends of the upper structure 311 can overlap surfaces of the color resist matrices on both sides.

The black matrices 31 in this embodiment can be made of a material having electrical conductivity. For example, the material of the black matrices 31 are doped with graphene, or a thick metal chromium can be used to form the black matrices.

In other embodiments, the black matrices 31 are coated with a layer of conductive layer. Material of the conductive layer may be nano silver or nano copper.

According to the above description, in the embodiment, by providing black matrices having electrical conductivity, and a position of the black matrices corresponds to a position of the transparent electrode, electrical conductivity of a semi-transparent electrode is improved, an IR drop phenomenon is reduced, and illumination uniformity of the display panel is improved.

Figure 5:
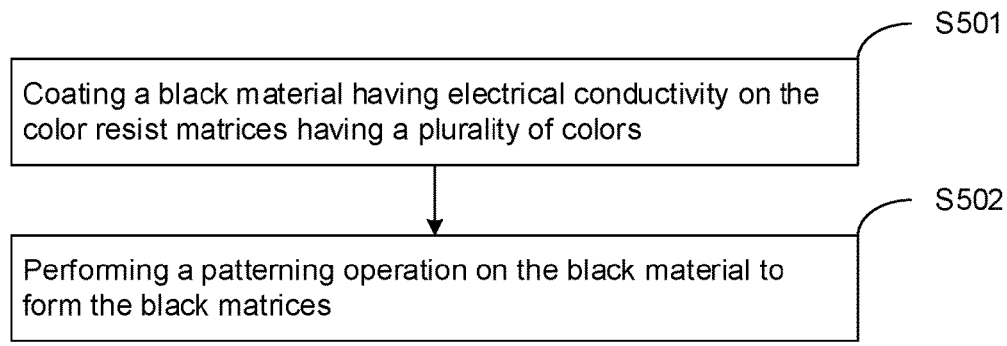
FIG. 5 is a schematic flowchart of a first embodiment of a step of forming black matrices in a method of manufacturing a display panel provided by the present application.

Referring to FIG. 5, FIG. 5 is a schematic flowchart of a first embodiment of a step of forming black matrices in a method of manufacturing a display panel provided by the present application.

Step S501: coating a black material having electrical conductivity on the color resist matrices having the plurality of colors.

Figure 2E:
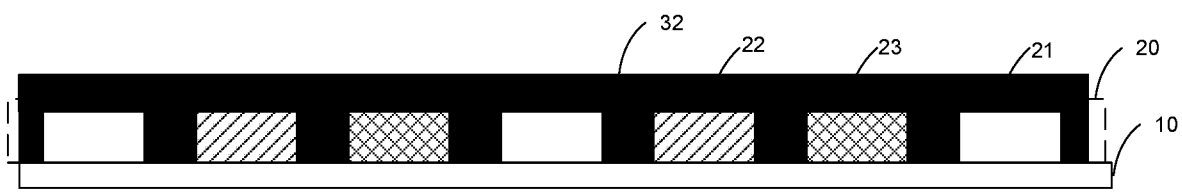
FIG. 2E is a schematic structural view of coating a black material having electrical conductivity on a plurality of color resist matrices having a plurality of colors in a method of manufacturing a display panel according to an embodiment of the present invention.

In a specific implementation scenario, referring to FIG. 2E, FIG. 2E is a schematic structural view of coating a black material having electrical conductivity on a plurality of color resist matrices having a plurality of colors in a method of manufacturing a display panel according to an embodiment of the present invention. As shown in FIG. 2E, a black material 32 is applied on the color filter layer 20, for example, a black material in which graphene is incorporated, or may be a thick metal chromium having a thickness greater than a thickness of the color filter layer 20.

Step S502: performing a patterning operation on the black material having electrical conductivity to form black matrices.

In a specific implementation scenario, after performing at least one of drying, exposure, and development on the coated black material 32, the black matrices are patterned to form black matrices such that the black matrices and the transparent electrode of the display panel correspond. The method of forming the black matrices can adopt the prior art in the art and will not be described again here.

As apparent from the above description, in the embodiment, the black matrices are formed by using a black material having electrical conductivity. No additional process is required, and the method is simple and easy to implement. The black matrices having electrical conductivity are corresponding to the transparent electrode, which can improve electrical conductivity of the transparent electrode, thereby improving illumination uniformity of the display panel.

Figure 6:
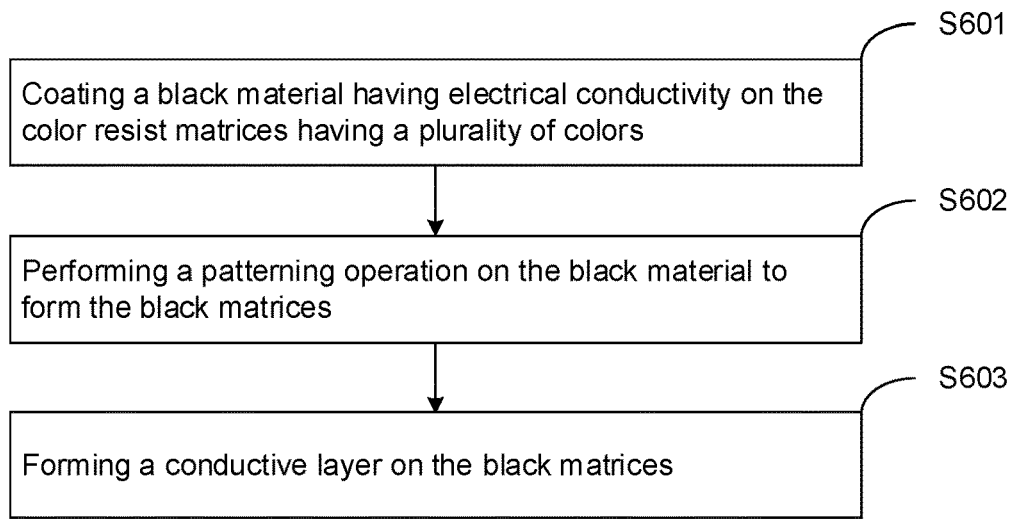
FIG. 6 is a schematic flowchart of a second embodiment of a step of forming black matrices in a method of manufacturing a display panel provided by the present application.

Referring to FIG. 6, FIG. 6 is a schematic flowchart of a second embodiment of a step of forming black matrices in a method of manufacturing a display panel provided by the present application.

Step S601: coating a black material on the plurality of color resist matrices having the plurality of colors.

Figure 2F:
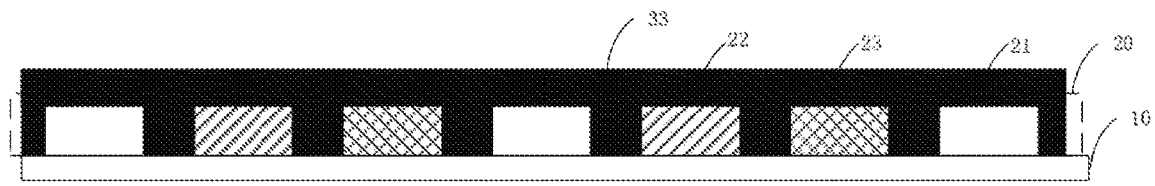
FIG. 2F is a schematic structural view of coating a black material on a plurality of color resist matrices having a plurality of colors in a method of manufacturing a display panel according to an embodiment of the present invention.

In a specific implementation scenario, please refer to FIG. 2F. FIG. 2F is a schematic structural view of coating a black material on a plurality of color resist matrices having a plurality of colors in a method of manufacturing a display panel according to an embodiment of the present invention. As shown in FIG. 2F, a black material 32 is applied on the color filter layer 20, which is a commonly used material for forming a black matrix. A thickness of the black material 32 is greater than a thickness of the color filter layer 20.

Step S602: performing a patterning operation on the black material to form black matrices.

In a specific implementation scenario, the step is substantially the same as the step S502 in the first embodiment of the step of forming the black matrices in the method of manufacturing the display panel provided by the present application, and details are not described herein.

Step S603: forming a conductive layer on the black matrices.

Figure 7:
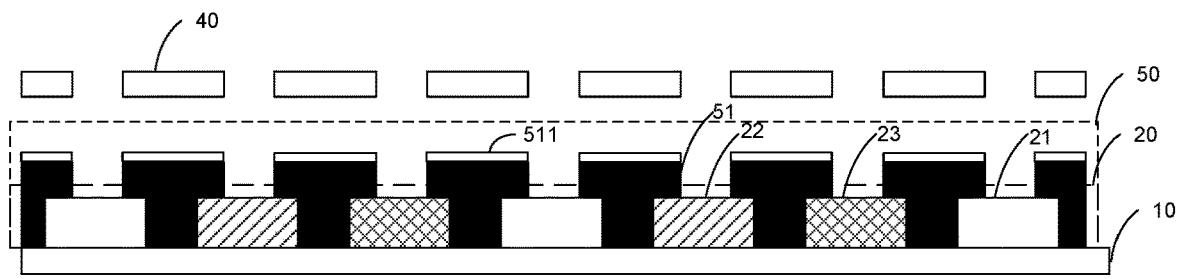
FIG. 7 is a schematic structural view of a second embodiment of a display panel provided by the present invention.

In a specific implementation scenario, referring to FIG. 7, FIG. 7 is a schematic structural diagram of a second embodiment of a display panel provided by the present invention. In the present embodiment, nano silver is printed on the black matrices 51, and nano copper is used as the conductive layer 511. In other implementation scenarios, other materials having electrical conductivity can be coated on the black matrices 51 to form the conductive layer by other means.

It can be seen from the above description that the conductive layer is disposed on the black matrices, and the black matrices are disposed corresponding to the transparent electrode. When the black matrices are in contact with the transparent electrode, electrical conductivity of the transparent electrode can be effectively improved, thereby improving luminous uniformity of the display panel.

Figure 8:
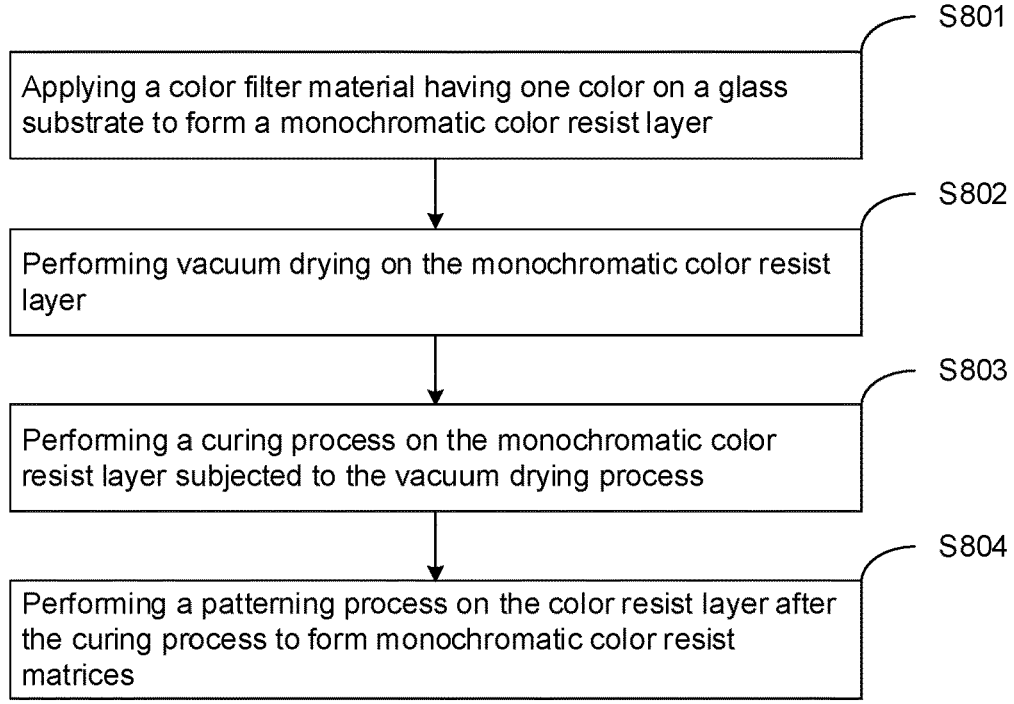
FIG. 8 is a schematic flowchart of an embodiment of a step of forming a monochromatic color resist matrix on a glass substrate in a method of manufacturing a display panel provided by the present application.

Referring to FIG. 8, FIG. 8 is a schematic flowchart of an embodiment of a step of forming a monochromatic color resist matrix on a glass substrate in a method of manufacturing a display panel provided by the present application.

Step S801: applying a color filter material having one color on the glass substrate to form a monochromatic color resist layer.

In a specific implementation scenario, referring to FIG. 2A, FIG. 2A is a schematic structural view of forming a monochromatic color resist layer on a glass substrate in a method of manufacturing a display panel according to an embodiment of the present invention. As shown in FIG. 2A, a color filter material having one color, such as a red color filter material, is scraped on a surface of the glass substrate 10 to form a monochromatic color resist layer 24. A thickness of the color filter material can be controlled from 0.1 to 10 um.

Step S802: performing vacuum drying on the monochromatic color resist layer.

In a specific implementation scenario, the monochromatic color resist layer 24 is subjected to a vacuum drying process. The monochromatic color resist layer 24 is sent to a vacuum drying apparatus for preliminary curing of a solvent.

Step S803: performing a curing process on the monochromatic color resist layer subjected to the vacuum drying process.

In a specific implementation scenario, the monochromatic color resist layer 24 subjected to the vacuum drying process is cured. In the embodiment, the curing process is performed by heating. After the preliminary dried monochromatic color resist layer 24 is formed, a thermal baking process is required to achieve shaping of the monochromatic color resist layer 24. The heat process temperature may be 100 to 250° C., and the time thereof may be 1 to 120 min. The curing process can be repeated multiple times until the curing requirements are met.

In other implementation scenarios, UV curing or a combination of UV curing and heat curing may also be employed.

Step S804: performing a patterning process on the color resist layer after the curing process to form monochromatic color resist matrices.

In a specific implementation scenario, the monochromatic color resist layer after curing is subjected to light, development, cleaning, baking, etc. to form a monochromatic color resist matrix 21, see FIG. 2B.

It can be seen from the above description that in the present embodiment, the monochromatic color resist layer is vacuum dried, cured, and patterned by scraping a color filter material having one color on the glass substrate to form a monochromatic color resist layer. The method of forming the monochromatic color resistance matrix is simple, the technology is mature, and it is easy to implement.

Referring to FIG. 3, FIG. 3 is a schematic structural view of a first embodiment of a display panel provided by the present invention. The display panel provided by the embodiment of the present invention includes a glass substrate 10, a color filter layer 20, a black matrix layer 30, and a transparent electrode 40.

The color filter layer 20 is disposed on a surface of the glass substrate 10 and includes a plurality of color resist matrices having a plurality of colors, for example, a plurality of blue color resist matrices 23, green color resist matrices 22, and red color resist matrices 21. The color filter layer has a thickness of greater than or equal to 0.1 um and less than or equal to 10 um. The black matrix layer 30 and the color filter layer 20 are disposed on the same side of the glass substrate 10. The black matrix layer 30 includes a plurality of black matrices 31 having a height not lower than a height of the color filter layer 20 and is made of a material having electrical conductivity. A position of the transparent electrode 40 corresponds to a position of the black matrices 31 and overlapping of the transparent electrode 40 and the black matrices 31 is achieved.

It can be seen from the above description that in the embodiment, the black matrices of the display panel have electrical conductivity and overlap with the transparent electrode, so that electrical conductivity of the transparent electrode can be effectively improved, thereby improving illumination uniformity of the display panel.

Referring to FIG. 7, FIG. 7 is a schematic structural view of a second embodiment of a display panel provided by the present invention. The display panel provided by the embodiment of the present invention includes a glass substrate 10, a color filter layer 20, a black matrix layer 50, and a transparent electrode 40.

The color filter layer 20 is disposed on a surface of the glass substrate 10 and includes a plurality of color resist matrices having a plurality of colors, for example, a plurality of blue color resist matrices 23, green color resist matrices 22, and red color resist matrices 21. The color filter layer has a thickness of greater than or equal to 0.1 um and less than or equal to 10 um. The black matrix layer 30 and the color filter layer 20 are disposed on the same side of the glass substrate 10, and the black matrix layer 30 includes a plurality of black matrices 31. A height of the black matrices 31 is not lower than a height of the color filter layer 20, and surfaces of the black matrices 31 are coated with a conductive layer 311. A position of the transparent electrode 40 corresponds to a position of the black matrices 31 and overlapping of the transparent electrode 40 and the black matrices 31 is achieved.

It can be seen from the above description that the conductive layer is disposed on the black matrices, and the black matrices are disposed corresponding to the transparent electrode. When the black matrices are in contact with the transparent electrode, electrical conductivity of the transparent electrode can be effectively improved, thereby improving luminous uniformity of the display panel.

It should be noted that the display panel in an embodiment of the present invention may be an OLED display panel or may be at least one of a QLED display panel, a micro-LED display panel, and a PeLED display panel.

Different from the prior art, in this embodiment, by providing black matrices having electrical conductivity, and a position of the black matrices corresponds to a position of the transparent electrode, electrical conductivity of the transparent electrode is improved by overlapping of the black matrices having electrical conductivity and the transparent electrode, thereby illumination uniformity of the display panel can be improved.

The above description is only an embodiment of the present invention and is not intended to limit the scope of the present invention. The equivalent structure or equivalent process transformations made by the specification and the drawings of the present invention are directly or indirectly applied to other related technical fields, and are included in the patent protection scope of the present invention.

What is claimed is:

1. A method of manufacturing a display panel, comprising:
    forming a color filter layer on a glass substrate, wherein the color filter layer comprises a plurality of color resist matrices having a plurality of colors, the color filter layer comprises color resist blocks having at least three colors, and/or a thickness of the color filter layer is greater than or equal to 0.1 um and less than or equal to 10 um;
    coating a black material having electrical conductivity on the color filter layer and performing a patterning operation on the black material to form a black matrix layer, wherein the black matrix layer comprises a plurality of black matrices, the black matrices have electrical conductivity, and a position of the black matrices corresponds to a position of a transparent electrode; and
    forming a conductive layer on the black matrix layer, wherein the black matrix layer is in direct contact with the conductive layer;
    wherein each of the black matrices comprises an upper structure and a base structure, a cross-sectional area of the upper structure is larger than a cross-sectional area of the base structure, such that both ends of the upper structure overlap surfaces of the color resist matrices on both sides;
    wherein the upper structure is rectangular, the base structure is rectangular, a gap between the color resist matrices is a rectangle, and a thickness of each of the black matrices is greater than a thickness of the color filter layer.

2. A method of manufacturing a display panel, comprising:
    forming a color filter layer on a glass substrate, wherein the color filter layer comprises a plurality of color resist matrices having a plurality of colors;
    forming a black matrix layer between the color resist matrices having the plurality of colors, wherein the black matrices have electrical conductivity, and a position of the black matrices corresponds to a position of a transparent electrode; and forming a conductive layer on the black matrix layer, wherein the black matrix layer is in direct contact with the conductive layer;

wherein each of the black matrices comprises an upper structure and a base structure, a cross-sectional area of the upper structure is larger than a cross-sectional area of the base structure, such that both ends of the upper structure overlap surfaces of the color resist matrices on both sides;

wherein the upper structure is rectangular, the base structure is rectangular, a gap between the color resist matrices is a rectangle, and a thickness of each of the black matrices is greater than a thickness of the color filter layer.

3. The method of manufacturing the display panel according to claim 2, wherein forming the black matrix layer between the color resist matrices having the plurality of colors comprises:

coating a black material having electrical conductivity on the color filter layer and performing a patterning operation on the black material to form the black matrix layer.

4. The method of manufacturing the display panel according to claim 2, wherein forming the black matrix layer between the color resist matrices having the plurality of colors comprises:

coating a black material on the color filter layer and performing a patterning operation on the black material to form the black matrix layer.

5. The method of manufacturing the display panel according to claim 2, wherein forming the color filter layer on the glass substrate comprises:

forming a plurality of monochromatic color resist matrices having one color on the glass substrate; and forming a monochromatic color resist matrix having a monochromatic color different from the one color of the monochromatic color resist matrices between the monochromatic color resist matrices;

forming the monochromatic color resist matrices having the one color on the glass substrate comprising:

coating a color filter material having the one color on the glass substrate to form a monochromatic color resist layer;

performing a vacuum drying process on the monochromatic color resist layer;

performing a curing process on the monochromatic color resist layer subjected to the vacuum drying process; and performing a patterning operation on the monochromatic color resist layer subjected to the curing process to form the monochromatic color resist matrices.

6. The method of manufacturing the display panel according to claim 2, wherein the color filter layer comprises color resist blocks having at least three colors, and/or a thickness of the color filter layer is greater than or equal to 0.1 um and less than or equal to 10 um.

7. A display panel, comprising:

a glass substrate;

a color filter layer comprising a plurality of color resist matrices having a plurality of colors and disposed on a surface of the glass substrate;

a black matrix layer disposed on a same side of the glass substrate as the color filter layer, wherein the black matrix layer comprises a plurality of black matrices, and the black matrices are not disposed lower than the color resist matrices and have electrical conductivity; and a transparent electrode correspondingly overlapped with the black matrices;

wherein surfaces of the black matrices are provided with a conductive layer, and the black matrix layer is in direct contact with the conductive layer;

wherein each of the black matrices comprises an upper structure and a base structure, a cross-sectional area of the upper structure is larger than a cross-sectional area of the base structure, such that both ends of the upper structure overlap surfaces of the color resist matrices on both sides;

wherein the upper structure is rectangular, the base structure is rectangular, a gap between the color resist matrices is a rectangle, and a thickness of each of the black matrices is greater than a thickness of the color filter layer.

8. The display panel according to claim 7, wherein the black matrices are made of a conductive black material.

9. The display panel according to claim 7, wherein the color filter layer comprises color resist blocks having at least three colors.

10. The display panel according to claim 7, wherein a thickness of the color filter layer is greater than or equal to 0.1 um and less than or equal to 10 um.

* * * * *